United States Patent
Wang et al.

(10) Patent No.: US 7,462,537 B2
(45) Date of Patent: Dec. 9, 2008

(54) FABRICATING METHOD OF AN NON-VOLATILE MEMORY

(75) Inventors: Pin-Yao Wang, Hsinchu (TW); Liang-Chuan Lai, Hsinchu County (TW)

(73) Assignee: Powerchip Semiconductor Corp., Hsinchu (TW)

( * ) Notice: Subject to any disclaimer, the term of this patent is extended or adjusted under 35 U.S.C. 154(b) by 202 days.

(21) Appl. No.: 11/309,180

(22) Filed: Jul. 7, 2006

(65) Prior Publication Data

US 2007/0077711 A1     Apr. 5, 2007

Related U.S. Application Data

(62) Division of application No. 11/164,063, filed on Nov. 9, 2005, now Pat. No. 7,102,193.

(30) Foreign Application Priority Data

Jun. 17, 2005   (TW)   .............................. 94120135 A

(51) Int. Cl.
  *H01L 21/336*   (2006.01)

(52) U.S. Cl. ...................... 438/259; 438/233; 438/564; 257/E21.619; 257/E21.634; 257/E21.151

(58) Field of Classification Search ................. 438/558, 438/259, 257, 682, 233, 301, 561, 564, E21.619, 438/E21.634, E21.151
See application file for complete search history.

(56) References Cited

U.S. PATENT DOCUMENTS

| 4,839,309 | A  | * | 6/1989  | Easter et al.  | ................. | 438/404 |
| 6,465,334 | B1 | * | 10/2002 | Buynoski et al. | ............ | 438/591 |
| 7,056,792 | B2 | * | 6/2006  | Lin            | ............................ | 438/259 |
| 7,202,139 | B2 | * | 4/2007  | Yeo et al.     | .................... | 438/455 |
| 7,208,376 | B2 | * | 4/2007  | Chen et al.    | .................. | 438/259 |

\* cited by examiner

*Primary Examiner*—George Fourson
*Assistant Examiner*—Julio J. Maldonado
(74) *Attorney, Agent, or Firm*—Jianq Chyun IP Office

(57) ABSTRACT

A method of fabricating a non-volatile memory is provided. A substrate having a trench therein for forming a trench device is provided. Then, a doped metal silicide layer is formed on the substrate in the trench. A heating process is performed to form a source/drain area in the substrate under the doped metal silicide layer. Thereafter, a first conductive layer is formed on the doped metal silicide layer to fill up the trench.

9 Claims, 5 Drawing Sheets

FABRICATING METHOD OF AN NON-VOLATILE MEMORY

CROSS-REFERENCE TO RELATED APPLICATION

This is a divisional application of application Ser. No. 11/164,063, filed on Nov. 9, 2005, which claims the priority benefit of Taiwan patent application serial no. 94120135, filed on Jun. 17, 2005 and is now allowed. The entirety of each of the above-mentioned patent applications is hereby incorporated by reference herein and made a part of this specification.

BACKGROUND OF THE INVENTION

1. Field of the Invention

The present invention relates to a fabricating method of a semiconductor device. More particularly, the present invention relates to a fabricating method of an non-volatile memory.

2. Description of the Related Art

Memory is a semiconductor device designed to store data or parameters. With the production of increasingly powerful microprocessors, the size of the software programs that are operated by memory increases correspondingly. As a result, the demand for a high storage capacity memory is getting higher and higher. The challenge of producing memory with a larger storage capacitor in accordance with this trend is now the force driving the techniques and processes for developing highly integrated semiconductor devices.

Among the memory products, non-volatile memory is one type of memory device having the capacity for writing data into, reading data from and erasing stored data multiples of times. Moreover, data will be retained even if the power to the device is cut off. With these advantages, it has become one of the most widely adopted memory devices in personal computer and electronic equipment.

FIG. 1 is a schematic cross-sectional view of a trench-type device. As shown in FIG. 1, the substrate 100 has a plurality of trenches 102 with a trench device disposed in each trench 102. The trench device is a trench-type memory, for example, comprising a floating gate 104, a control gate 108 and a dielectric layer 106. The floating gate 104 and the control gate 108 are both fabricated from doped polysilicon material. Furthermore, there are source/drain regions 110 underneath the trench device. The source/drain regions 110 are formed by performing an ion implant process, for example.

However, with the increase in the level of integration, the distance separating two adjacent trench-type devices has to be reduced. In other words, the distance between the source/drain regions 110 has to be reduced. Because of the short distance separating the source/drain regions 110, some of the dopants in the source/drain regions 110 may diffuse into the substrate 100 leading to abnormal electrical punch through between adjacent source/drain regions 110. On the other hand, in the process of forming the control gate 108 using a doped polysilicon material, some of the dopants inside the control gate 108 will also diffuse into the source/drain regions 110 and expand the source/drain regions 110. This phenomenon further exacerbates the ease of forming an abnormal electrical punch through between neighboring source/drain regions 110. In some cases, some of the dopants may diffuse into the surrounding dielectric layer and seriously affect the ultimate reliability of the device. Furthermore, the control gate 108 formed from the doped polysilicon material has a higher line resistance. Hence, the performance of the device will also be affected.

SUMMARY OF THE INVENTION

Accordingly, at least one objective of the present invention is to provide a non-volatile memory having a doped metal silicide layer and a control gate fabricated using a metallic material.

At least a second objective of the present invention is to provide a method of fabricating non-volatile memory such that heat is used to drive an outward diffusion of the dopants within a doped metal silicide layer to form source/drain regions.

To achieve these and other advantages and in accordance with the purpose of the invention, as embodied and broadly described herein, the invention provides a method of fabricating non-volatile memory. First, a substrate having a trench therein for forming a trench device is provided. Then, a doped metal silicide layer is formed on the substrate in the trench. A heating process is performed to form a source/drain area in the substrate under the doped metal silicide layer. Thereafter, a first conductive layer is formed on the doped metal silicide layer to fill up the trench.

According to the method of fabricating the non-volatile memory in the embodiment of the present invention, the doped metal silicide layer is fabricated using doped germanium silicide, for example.

According to the method of fabricating the non-volatile memory in the embodiment of the present invention, the method of forming the doped metal silicide layer includes performing a low-pressure chemical vapor deposition process with an in-situ dopant implant, for example.

According to the method of fabricating the non-volatile memory in the embodiment of the present invention, the thickness of the doped metal silicide layer is between about 100 Å~500 Å.

According to the method of fabricating the non-volatile memory in the embodiment of the present invention, the first conductive layer is fabricated using a metallic material, for example.

According to the method of fabricating the non-volatile memory in the embodiment of the present invention, the heating process includes performing a rapid thermal annealing operation.

According to the method of fabricating the non-volatile memory in the embodiment of the present invention, before forming the doped metal silicide layer, the method further includes forming a dielectric layer on the surface of the trench. Then, a floating gate is formed on the two sidewalls of the trench. Thereafter, a second dielectric layer is formed over the substrate. A portion of the second dielectric layer and the first dielectric layer in the trench are removed to expose the substrate. After that, a doped metal silicide layer is formed over the exposed substrate.

According to the method of fabricating the non-volatile memory in the embodiment of the present invention, the method of forming the floating gate includes depositing conductive material into the trench to form a conductive material layer. Then, the conductive material layer is patterned to form a floating gate on the respective sides of the trench.

According to the method of fabricating the non-volatile memory in the embodiment of the present invention, the conductive material layer is fabricated using doped polysilicon, for example.

According to the method of fabricating the non-volatile memory in the embodiment of the present invention, the third dielectric layer is formed over the substrate after the first conductive layer is formed.

The present invention also provides a non-volatile memory structure. The non-volatile memory comprises a substrate, a first dielectric layer, a pair of floating gates, a control gate, a second dielectric layer, a doped metal silicide layer and a first source/drain region. The substrate has a trench therein. The first dielectric layer is disposed on the sidewalls of the trench and a portion of the bottom area of the trench. The floating gate is disposed on the two sidewalls of the trench above the first dielectric layer. The control gate is disposed in the trench with a top part higher than the upper surface of the substrate. The second dielectric layer is disposed between the floating gate and the control gate above the first dielectric layer. The doped metal silicide layer is disposed between the control gate and the substrate. The first source/drain region is disposed in the substrate underneath the doped metal silicide layer.

According to the non-volatile memory in the embodiment of the present invention, the doped metal silicide layer is fabricated using doped germanium silicide, for example.

According to the non-volatile memory in the embodiment of the present invention, the thickness of the doped metal silicide layer is between about 100 Å~500 Å.

According to the non-volatile memory in the embodiment of the present invention, the control gate is fabricated using a metallic material, for example.

According to the non-volatile memory in the embodiment of the present invention, the memory may further include a third dielectric layer disposed over the substrate to cover the control gate and a conductive layer disposed over the third dielectric layer.

According to the non-volatile memory in the embodiment of the present invention, the conductive layer disposed on the sidewalls of the control gate is higher than the surface of the substrate.

According to the non-volatile memory in the embodiment of the present invention, the memory may further include a second source/drain region disposed in the substrate on the two sides of the conductive layer.

According to the non-volatile memory in the embodiment of the present invention, the floating gate is fabricated using doped polysilicon, for example.

According to the non-volatile memory in the embodiment of the present invention, the first dielectric layer is fabricated using silicon oxide ($SiO_2$), for example.

According to the non-volatile memory in the embodiment of the present invention, the second dielectric layer is fabricated using silicon oxide, for example.

According to the non-volatile memory in the embodiment of the present invention, the third dielectric layer is fabricated using silicon oxide, for example.

In the present invention, the line resistance in the source/drain region is reduced by forming the doped metal silicide layer under the control gate. Furthermore, through a heating process, the dopants inside the doped metal silicide layer will diffuse into the underlying substrate to form the source/drain region. Thus, abnormal electrical punch through between adjacent source/drain regions due to over-expansion of the source/drain regions is prevented so that a better short channel effect is obtained. In addition, using a metallic substance to form the control gate of a memory also prevents any adverse effects on device performance due to the diffusion of dopants into the tunneling oxide layer.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

Figure 1:
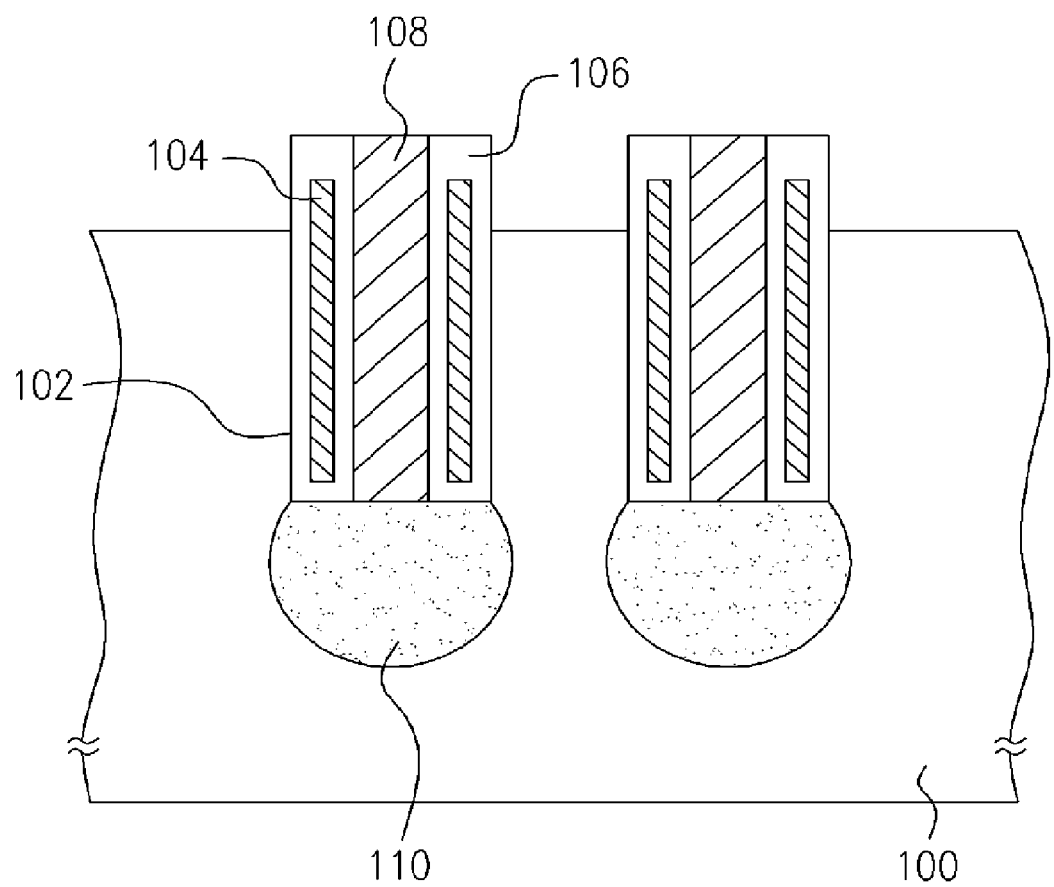
FIG. 1 is a schematic cross-sectional view of a trench-type device.

Reference will now be made in detail to the present preferred embodiments of the invention, examples of which are illustrated in the accompanying drawings. Wherever possible, the same reference numbers are used in the drawings and the description to refer to the same or like parts.

Figure 2A:
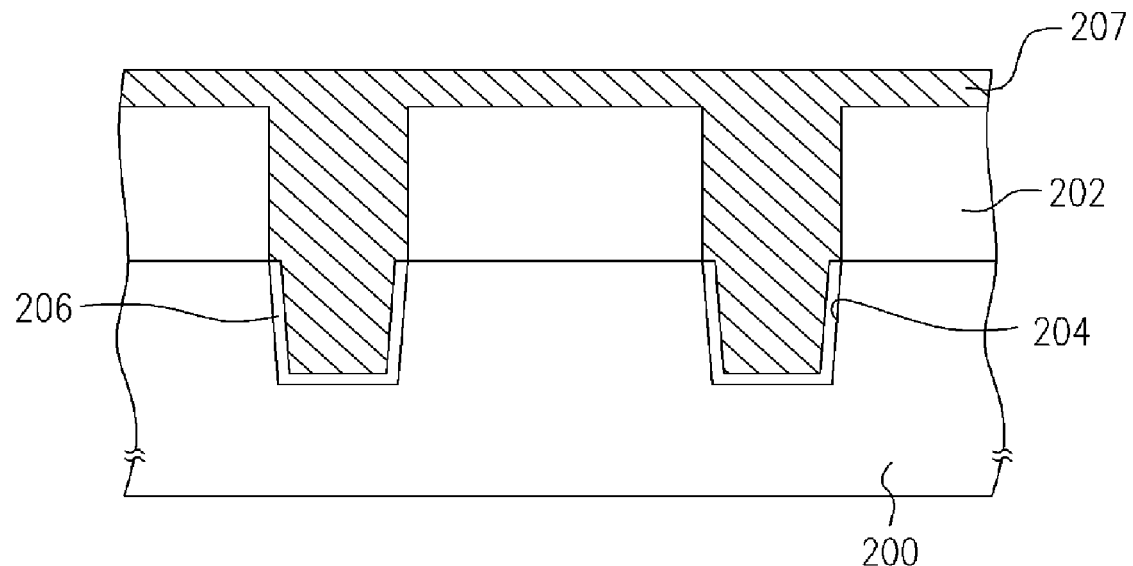
FIGS. 2A through 2G are schematic cross-sectional views showing the steps for fabricating a non-volatile memory according to one embodiment of the present invention.

FIGS. 2A through 2G are schematic cross-sectional views showing the steps for fabricating a non-volatile memory according to one embodiment of the present invention. First, as shown in FIG. 2A, a substrate 200 is provided. Then, a patterned mask layer 202 is formed over the substrate 200. The patterned mask layer 202 is fabricated using silicon nitride, for example. Thereafter, using the patterned mask layer 202 as a mask, an etching operation is carried out to form a trench 204 in the substrate 200. A dielectric layer 206, serving as a tunneling oxide layer, is formed on the surface of the trench 204. The dielectric layer 206 is fabricated using silicon oxide, for example. The dielectric layer 206 is formed, for example, by performing a thermal oxidation process. After that, conductive material is deposited into the trench 204 to form a conductive material layer 207. The conductive material layer 207 is a doped polysilicon layer formed, for example, by performing a chemical vapor deposition process to form a polysilicon layer and performing an ion implant process thereafter.

Figure 2B:
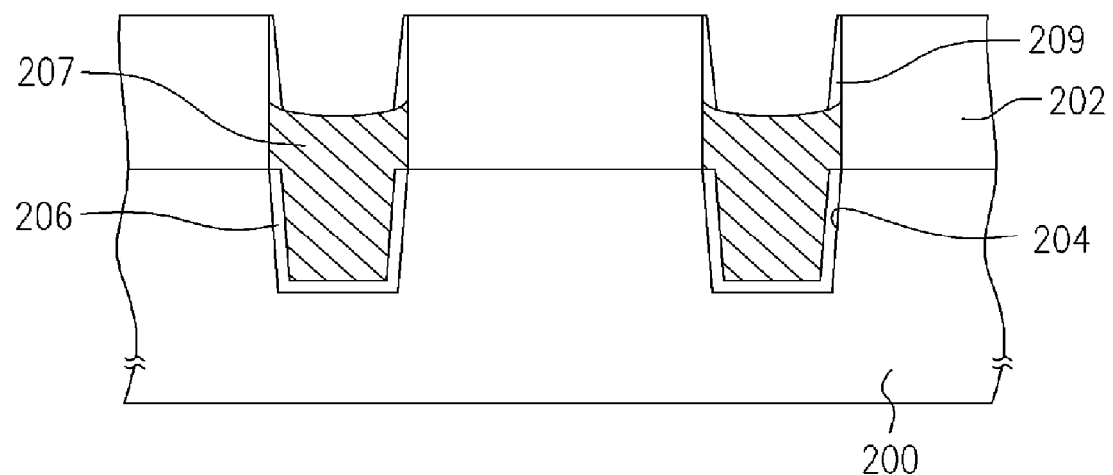

As shown in FIG. 2B, the conductive material layer 207 on the surface of the patterned mask layer 202 is removed. The method of removing the conductive material layer 207 includes performing a chemical-mechanical polishing operation, for example. Thereafter, an etching back operation is carried out to etch away a portion of the conductive layer 207 but retain some conductive layer 207 inside the trench 204 so that the top part is lower than the upper surface of the patterned mask layer 202. After that, spacers 209 are formed on the respective sidewalls of the trench 204 so that a portion of the upper surface of the conductive layer 207 is also covered. The spacers 209 are fabricated using a material having an etching selectivity different from the conductive layer 207, for example. The method of forming the spacers 209 includes depositing insulating material to form an insulating material layer (not shown) and performing an anisotropic etching operation to remove a portion of the insulating material layer thereafter.

Figure 2C:
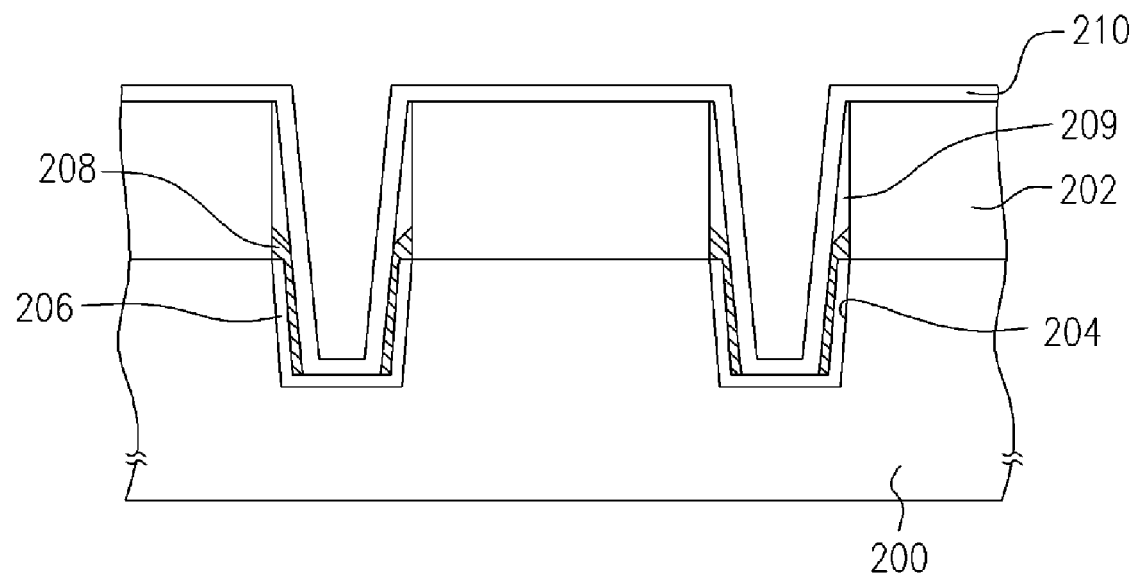

As shown in FIG. 2C, using the patterned mask layer 202 and the spacers 209 as an etching mask, the conductive layer 207 is patterned to form a pair of floating gates 208 on the sidewalls of the trench 204. Then, a dielectric layer 210 is formed over the substrate 200. The dielectric layer 210 can be a composite layer including, from the bottom upward, a silicon oxide layer, a silicon nitride layer and another silicon oxide layer. Obviously, the dielectric layer 210 can also be a composite layer including a silicon oxide layer and a silicon nitride layer or only a single silicon oxide layer. The dielectric layer 210 is formed, for example, by performing a chemical vapor deposition process.

Figure 2D:
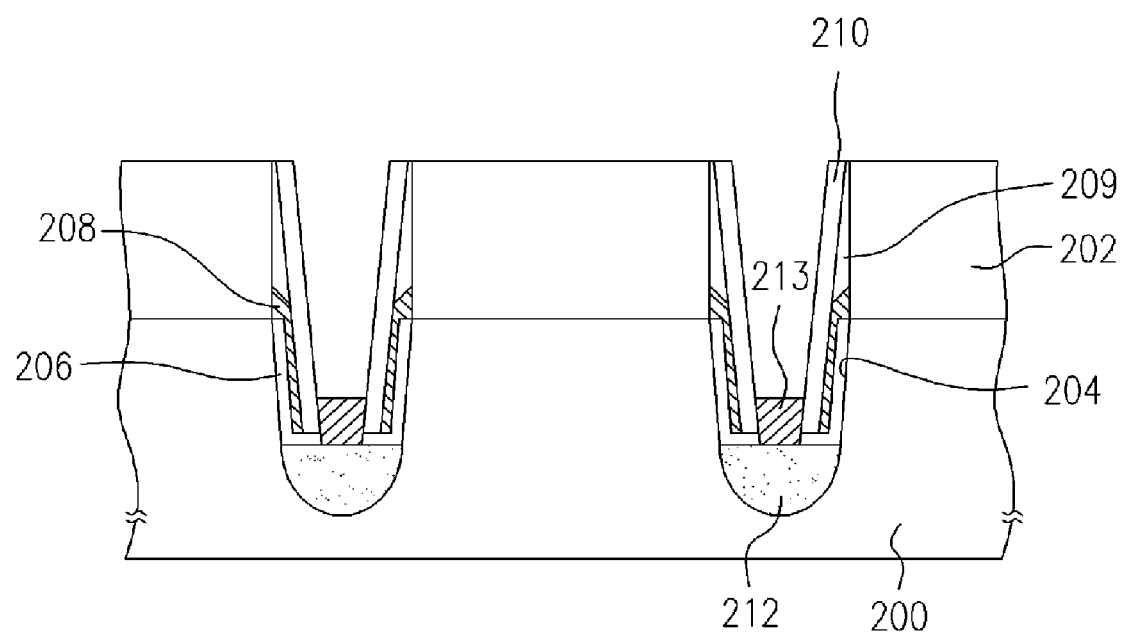

As shown in FIG. 2D, a portion of the dielectric layer 206 and the dielectric layer 210 inside the trench 204 are removed to expose the substrate 200, and the dielectric layer 210 on the patterned mask layer 202 is also removed. The method of removing a portion of the dielectric layers 206 and 210 includes performing an anisotropic etching operation such as a dry etching operation. Thereafter, a doped metal silicide layer 213 is formed on the exposed substrate 200. The doped metal silicide layer 213 is a doped germanium silicide layer formed, for example, by performing a low-pressure chemical vapor deposition process with in-situ dopant implant. In addition, the doped metal silicide layer 213 has a thickness between about 100 Å~500 Å. After that, a heating process is carried out to initiate a diffusion of the dopants within the doped metal silicide layer 213 into the substrate 200 underneath the doped metal silicide layer 213 for forming source/drain regions 212. The heating process includes a rapid thermal annealing process, for example.

Figure 2E:
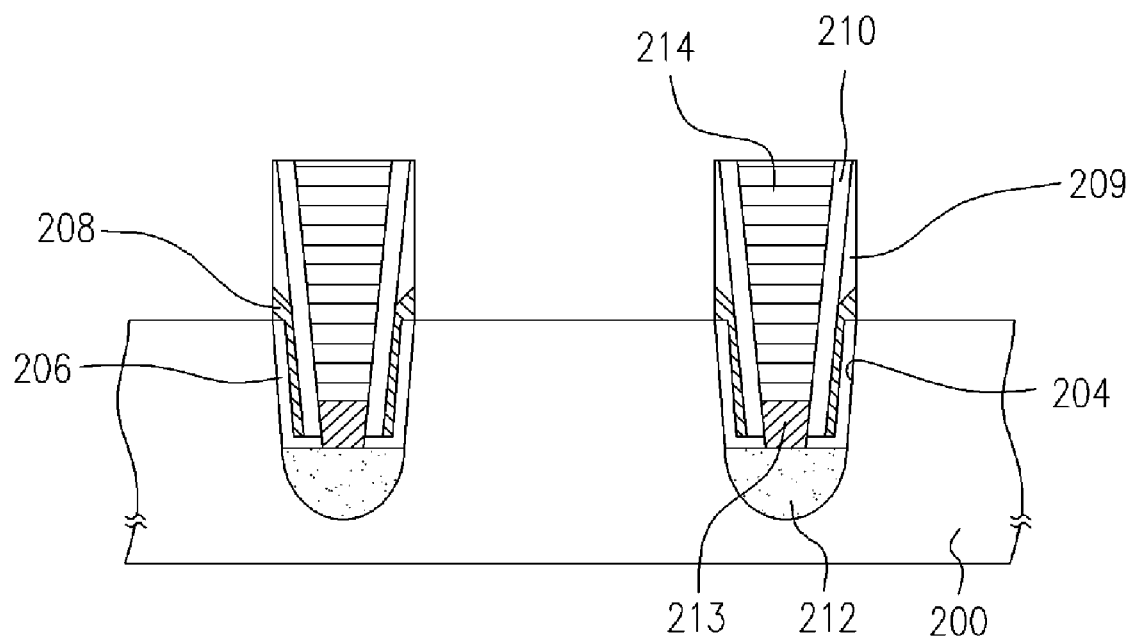

As shown in FIG. 2E, a conductive material layer (not shown) is formed over the substrate 200 to fill the trench 204. The conductive material layer is fabricated from a metallic substance, for example. Then, a portion of the conductive material layer is removed to expose the patterned mask layer 202 and form a conductive layer 214 that serves as the control gate. Thereafter, the patterned mask layer 202 is removed.

Figure 2F:
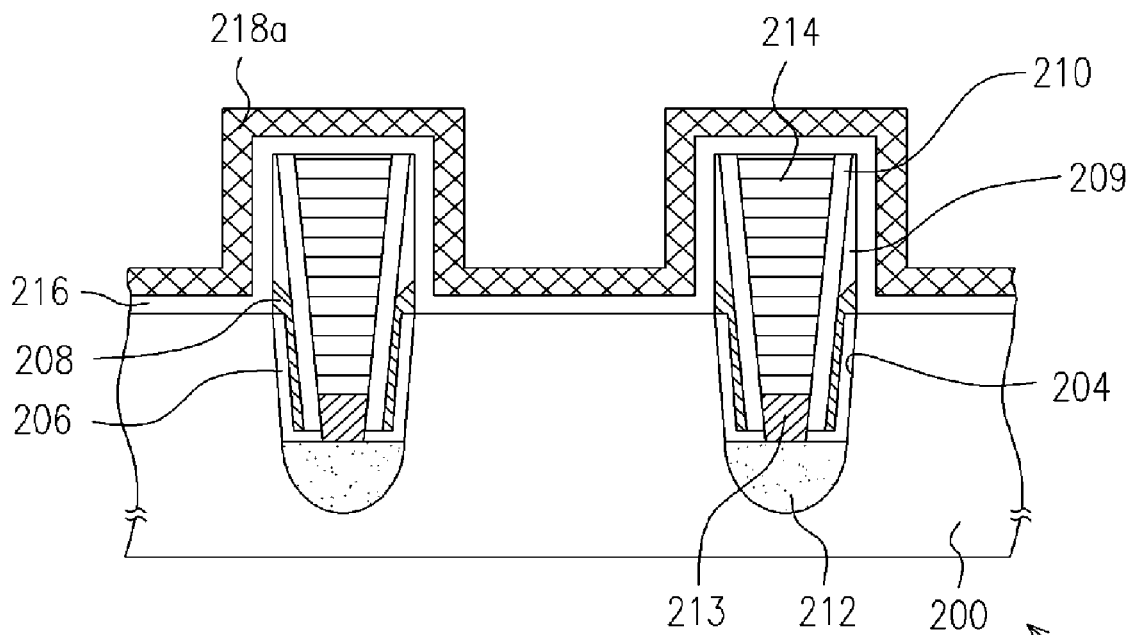

As shown in FIG. 2F, a dielectric layer 216 is formed over the substrate 200. The dielectric layer 216 is a silicon oxide layer, for example. Thereafter, a conductive layer 218a is formed over the dielectric layer 216 to serve as a word line, thereby completing the fabrication of a non-volatile memory 20. The conductive layer 218a is fabricated using doped polysilicon, for example.

Figure 2G:
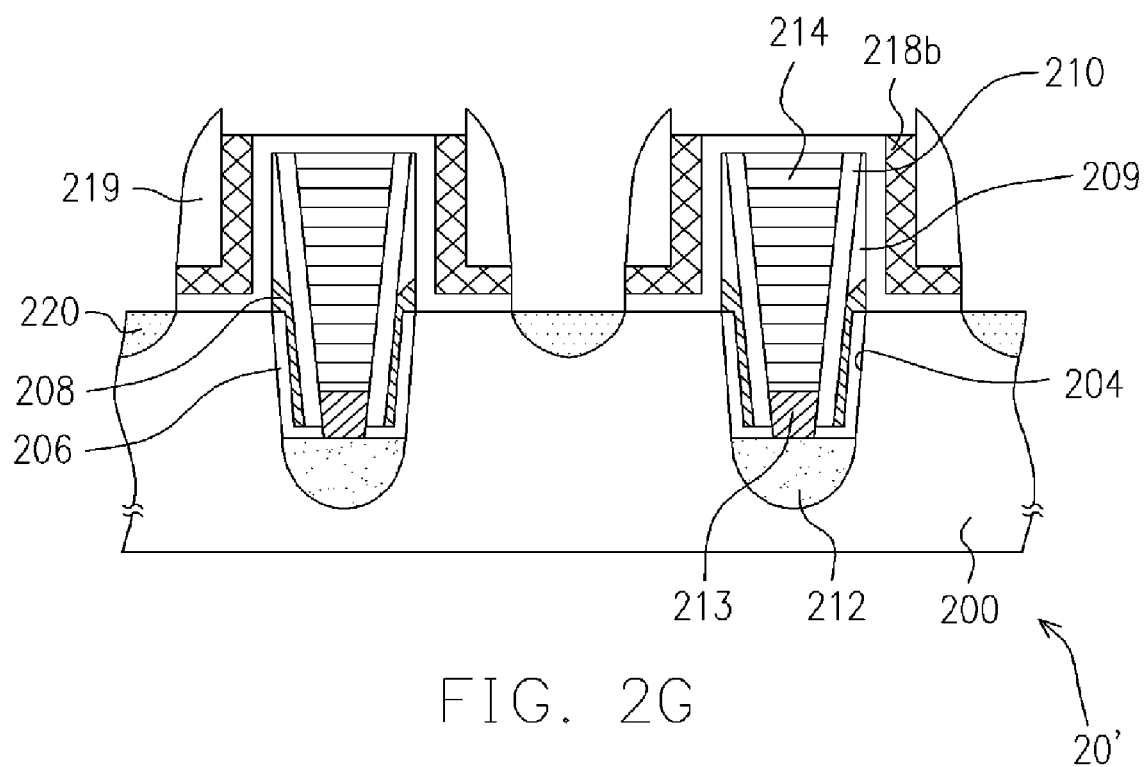

In another embodiment, the following steps may be carried out to fabricate another non-volatile memory 20' after all the steps shown from FIGS. 2A through FIG. 2F are carried through. As shown in FIG. 2G, spacers 219 are formed on the conductive layer 218a on the sidewalls of the conductive layer 214. Then, using the spacers 219 as a mask, a portion of the conductive layer 218a is removed to form a conductive layer 218b. The method of removing a portion of the conductive layer 218a includes performing an anisotropic etching operation. Thereafter, a source/drain region 220 is formed in the substrate 200 on the respective side of the conductive layer 218b. Hence, two memory units that use a common control gate (the conductive layer 214) are formed. The source/drain regions 220 are formed, for example, by performing an ion implant process.

It should be noted that the non-volatile memory fabricated in the present invention (shown in FIGS. 2F and 2G) has a doped metal silicide layer underneath the control gates. Furthermore, the two control gates are fabricated using a metallic material. Hence, abnormal electrical punch through due to the penetration of dopants into the source/drain region in the substrate underneath the doped metal silicide layer and the subsequent expansion of the source/drain region and diffusion into the surrounding dielectric layer can be prevented.

In the aforementioned method of fabricating non-volatile memory, a doped metal silicide layer is formed before forming the control gates. Then, a rapid thermal annealing process is carried out to drive the dopants in the doped metal silicide layer by diffusion into the substrate underneath, thereby forming doped regions to serve as the source/drain regions. Because the doped regions are restricted to specified locations, abnormal electrical punch through and short channel effect can be avoided. Furthermore, the doped metal silicide layer can increase conductivity and lower the line resistance in the source/drain regions. In addition, using metallic material instead of doped polysilicon to fabricate the control gates can prevent the dopants inside the doped polysilicon layer from diffusing into the tunneling oxide layer leading to reliability problems in the memory device.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of fabricating a non-volatile memory, the method comprising:

providing a substrate having a trench therein, wherein the trench is used for accommodating a trench device;

forming a doped metal silicide layer over the substrate within the trench, wherein a material constituting the doped metal silicide layer comprises germanium silicide;

performing a heating process to form a source/drain region in the substrate underneath the doped metal silicide layer; and forming a first conductive layer over the doped metal silicide layer to fill up the trench.

2. The method of claim 1, wherein the step of forming the doped metal silicide layer comprises performing a low-pressure chemical vapor deposition process with an in-situ dopant implantation.

3. The method of claim 1, wherein the doped metal silicide layer has a thickness between about 100 Å~500 Å.

4. The method of claim 1, wherein a material forming the first conductive layer comprises a metallic substance.

5. The method of claim 1, wherein the heating process comprises performing a rapid thermal annealing operation.

6. The method of claim 1, wherein after forming the first conductive layer, the method further comprising:

forming a third dielectric layer over the substrate; and forming a second conductive layer over the third dielectric layer.

7. The method of claim 1, wherein before forming the doped metal silicide layer, the method further comprising:

forming a first dielectric layer over a surface of the trench;

forming a floating gate on respective sidewalls of the trench;

forming a second dielectric layer over the substrate; and removing a portion of the second dielectric layer and the first dielectric layer in the trench to expose the substrate and forming the doped metal silicide layer over the exposed substrate.

8. The method of claim 7, wherein the step of forming the floating gate comprises:

depositing a conductive material into the trench to form a conductive material layer; and patterning the conductive material layer to form the floating gate on the respective sidewalls of the trench.

9. The method of claim 8, wherein a material constituting the conductive material layer comprises doped polysilicon.

* * * * *